(12) United States Patent
Takebe et al.

(10) Patent No.: US 6,514,669 B2
(45) Date of Patent: Feb. 4, 2003

(54) PIGMENT-DISPERSION PHOTO-SENSITIVE COATING SOLUTION

(75) Inventors: Kazuo Takebe, Toyonaka (JP); Takao Mori, Neyagawa (JP); Shigeo Hozumi, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 48 days.

(21) Appl. No.: 09/734,620

(22) Filed: Dec. 13, 2000

(65) Prior Publication Data

US 2001/0004511 A1 Jun. 21, 2001

(30) Foreign Application Priority Data

Dec. 15, 1999 (JP) ............................................ 11-355751

(51) Int. Cl.⁷ ............................ G03F 1/10; G03F 7/033; G03F 7/30
(52) U.S. Cl. ................................. 430/281.1; 430/285.1; 430/910; 430/293; 430/7
(58) Field of Search ......................... 430/281.1, 285.1, 430/910, 293, 7

(56) References Cited

U.S. PATENT DOCUMENTS

| | | | | |
|---|---|---|---|---|
| 5,964,938 A | * | 10/1999 | Balliello | 106/493 |
| 5,998,091 A | * | 12/1999 | Suzuki | 430/270.1 |
| 6,120,944 A | * | 9/2000 | Schadeli et al. | 430/7 |
| 6,255,034 B1 | * | 7/2001 | Shimada et al. | 430/281.1 |
| 6,284,432 B1 | * | 9/2001 | Furubayashi et al. | 430/281.1 |
| 6,302,953 B1 | * | 10/2001 | Saikatsu et al. | 106/498 |

FOREIGN PATENT DOCUMENTS

| | | |
|---|---|---|
| JP | 10260309 | 9/1998 |
| JP | 11014824 | 1/1999 |

OTHER PUBLICATIONS

Registry No. 84632–65–5, Registry, Copyright 2002 ACS, C.I. Pigment Red 254, one page, from online STN database service. REgistry File.*

* cited by examiner

Primary Examiner—Cynthia Hamilton
(74) Attorney, Agent, or Firm—Birch, Stewart, Kolasch & Birch, LLP

(57) ABSTRACT

A pigment-dispersion photo-sensitive coating solution comprising a binder resin, an organic-solvent and a main pigment dispersed in the solvent, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard, is provided and use of the coating solution ensures that the colored image of stable quality is formed.

10 Claims, 3 Drawing Sheets

PIGMENT-DISPERSION PHOTO-SENSITIVE COATING SOLUTION

BACKGROUND OF THE INVENTION

The present invention relates to a pigment-dispersion photo-sensitive coating solution for forming a colored image (also called a picture element) employed in color liquid crystal displays or image pickup devices and a method for preparation thereof as well as to a method for forming a colored image using the same. More particularly, the invention relates to a pigment-dispersion photo-sensitive coating solution and a method for preparation thereof, which provide a coating film of uniform thickness and excellent surface roughness and are capable of forming a colored image excellent in transmittance and contrast. The invention also relates to a method of forming a colored image for a color filter by using the pigment-dispersion photo-sensitive coating solution.

The color filter in a color liquid crystal display, image pickup device or the like is normally produced by forming colored images of red, green and blue on a substrate such as glass substrate, film substrate, silicon wafer or the like. Typically, a black matrix is provided for blocking light leakage from these colored images. A method of forming the respective colored images includes the steps of: uniformly applying a photo-sensitive coating solution containing a pigment dispersion of each corresponding color by a spin coater on a substrate on which a pattern of a light blocking layer was formed; baking (prebaking) the solution to give a dry coating film; patterning the resultant coating film by light exposure and developing a colored image; and thermosetting (postbaking) the resultant image. The procedure is repeated for each of the colors required by the color filter whereby the colored images of the respective colors are obtained. In some cases, a photo-sensitive coating solution containing a black pigment may be used for forming the black matrix.

To form a red-colored image, C.I. Pigment Red 177, an anthraquinone type red pigment, is often used. On the other hand, C.I. Pigment Red 254 with diketopyrolopyrrole structure has attracted attention as a red pigment of an excellent color property. However, a problem exists in the practical use of this pigment because it is difficult to use it in the form of a coating solution.

The inventors have conducted studies, from various angles, on pigments used in a pigment-dispersion photo-sensitive coating solution for colored image formation. As the results, they have obtained following findings. The nature of the colored image is significantly influenced by the amount of a given component, present in the coating solution, which can be extracted from the pigment with an organic solvent, particularly with ethyl acetate. If a pigment rich in the given component is used in a pigment-dispersion photo-sensitive coating solution, the coating solution adversely affects the contrast of a colored image formed therefrom or sometimes produces a colored image poor in transmittance and surface roughness. If a pigment with a smaller content of the given component is selected and used in the coating solution, the resultant coating solution gives a colored image of high quality. Based on these findings, the present invention has been completed.

It is an object of the invention to provide a pigment-dispersion photo-sensitive coating solution selectively employing a pigment with a smaller content of a component adversely affecting the nature of a colored image for giving the colored image excellent in transmittance, surface roughness, contrast and the like. Another objects of the invention are to provide a method for preparation of the pigment-dispersion photo-sensitive coating solution, as well as to provide a method of forming the colored image of a color filter by using the pigment-dispersion photo-sensitive coating solution.

SUMMARY OF THE INVENTION

That is, the present invention provides a pigment-dispersion photo-sensitive coating solution which comprises a binder resin, an organic-solvent and a pigment dispersed in the solvent, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

The present invention also provides a method for producing a pigment-dispersion photo-sensitive coating solution which comprises the step of mixing together a pigment, a binder resin and an organic solvent for dispersing the pigment, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

The present invention also provides a method for forming a colored-image which comprises the steps of applying a pigment-dispersion photo-sensitive coating solution on a substrate, patterning a resultant coating film by light exposure and developing a colored image, wherein the pigment-dispersion photo-sensitive coating solution comprises a binder resin, an organic-solvent and a main pigment dispersed in the organic-solvent, in which the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

Description of the Symbols

A: A peak detected at a retention time of about 25 minutes which corresponds to a relative retention ratio of about 0.70 based on a retention time (about 36 minutes) of dibutyl phthalate;

B: A peak detected at a retention time of about 39 minutes which corresponds to a relative retention ratio of about 1.08 based on the retention time (about 36 minutes) of dibutyl phthalate.

DESCRIPTION OF THE PREFERRED EMBODIMENTS

A pigment-dispersion photo-sensitive coating solution according to the invention comprises a specific pigment. When the specific pigment comprised in the pigment-dispersion photo-sensitive coating solution according to the invention is extracted by ethyl acetate and the extracts are analyzed by high-speed liquid chromatography using dibutyl phthalate as internal standard, the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks.

Figure 1:
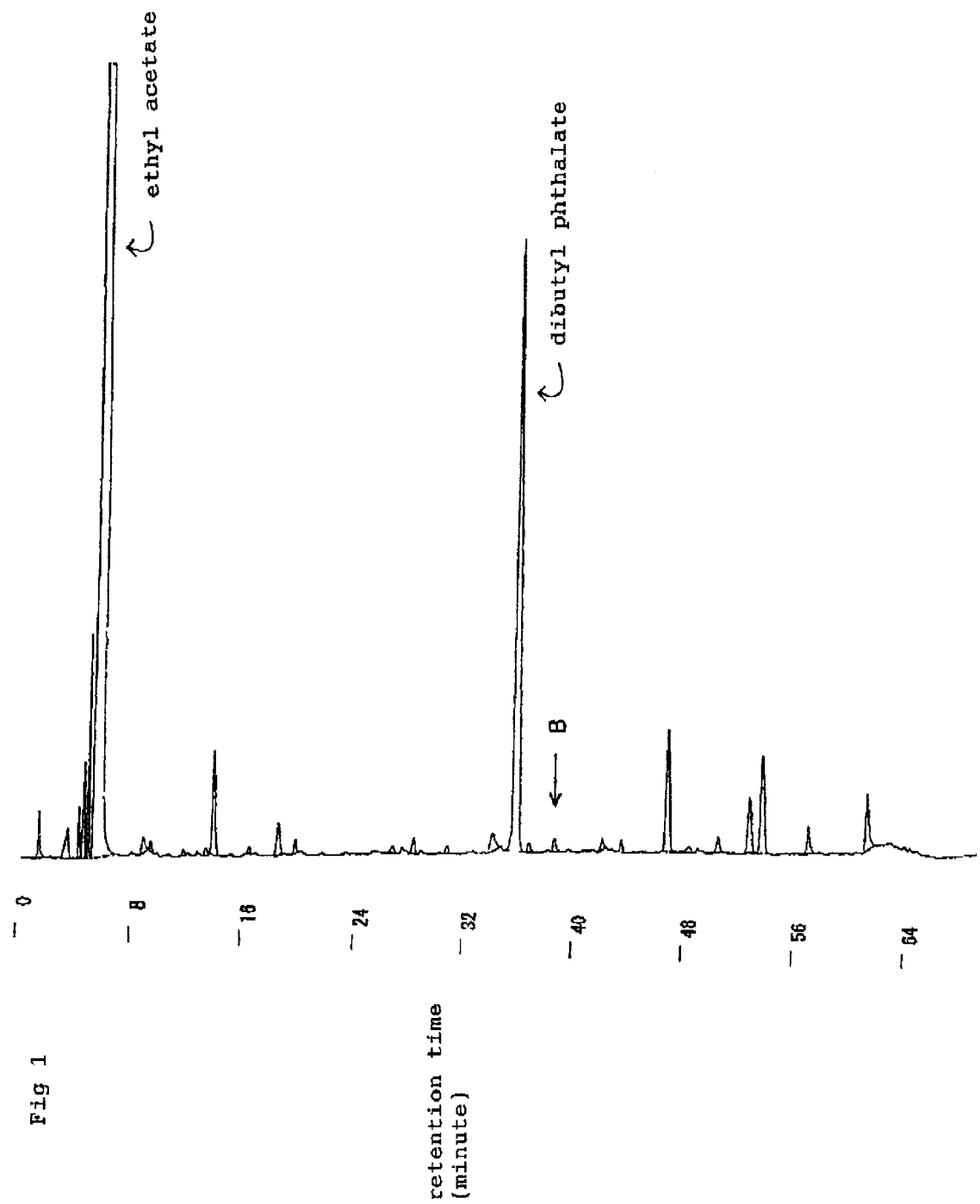
FIG. 1 is a chart given by high-speed liquid chromatography using dibutylphthalate as internal standard, showing extractables from one lot of C.I. Pigment Red 254 (Sample 1) by ethyl acetate.
Figure 2:
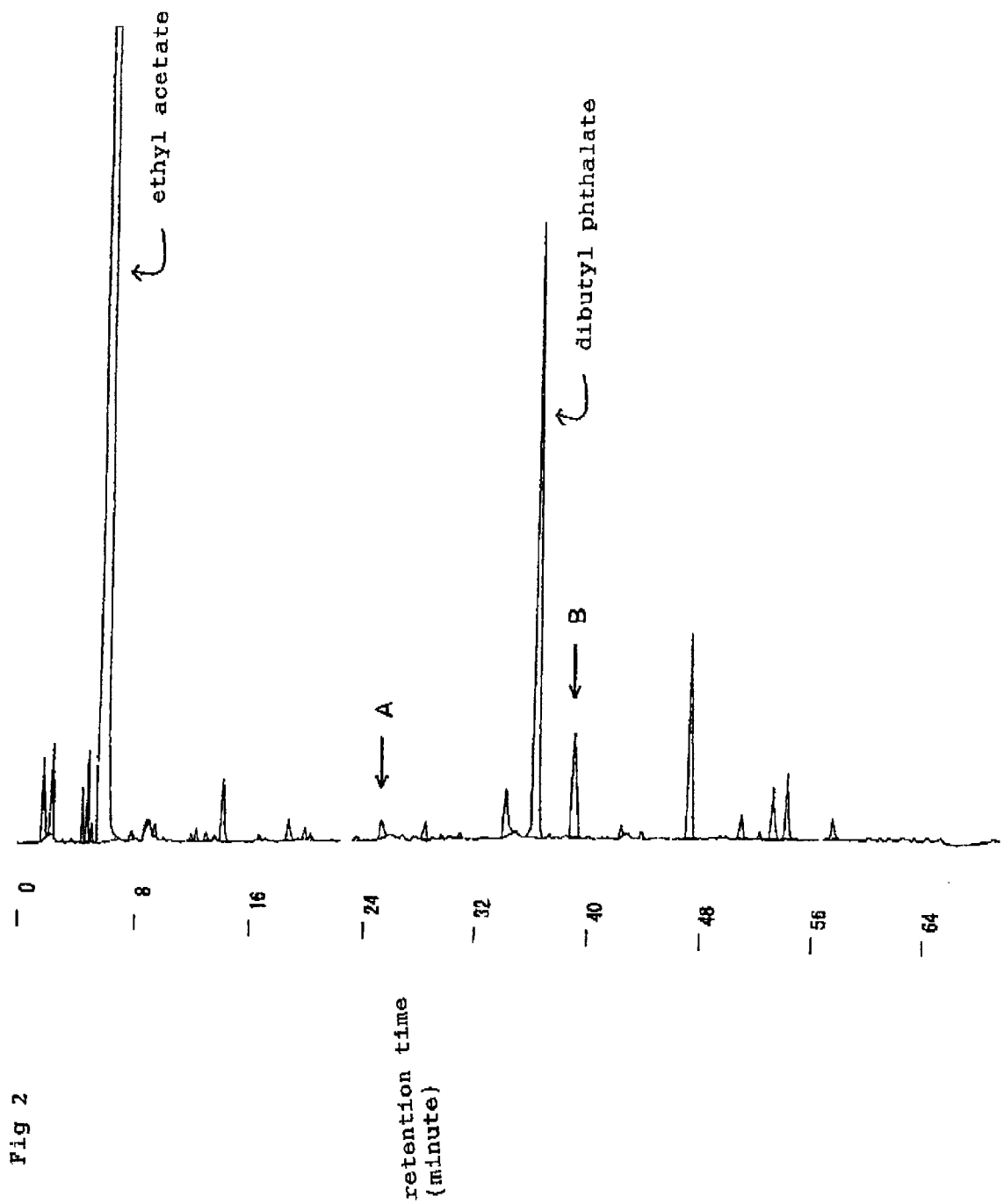
FIG. 2 is a chart given by high-speed liquid chromatography using dibutyl phthalate as internal standard, showing extractables from another lot of C.I. Pigment Red 254 (Sample 2) by ethyl acetate.
Figure 3:
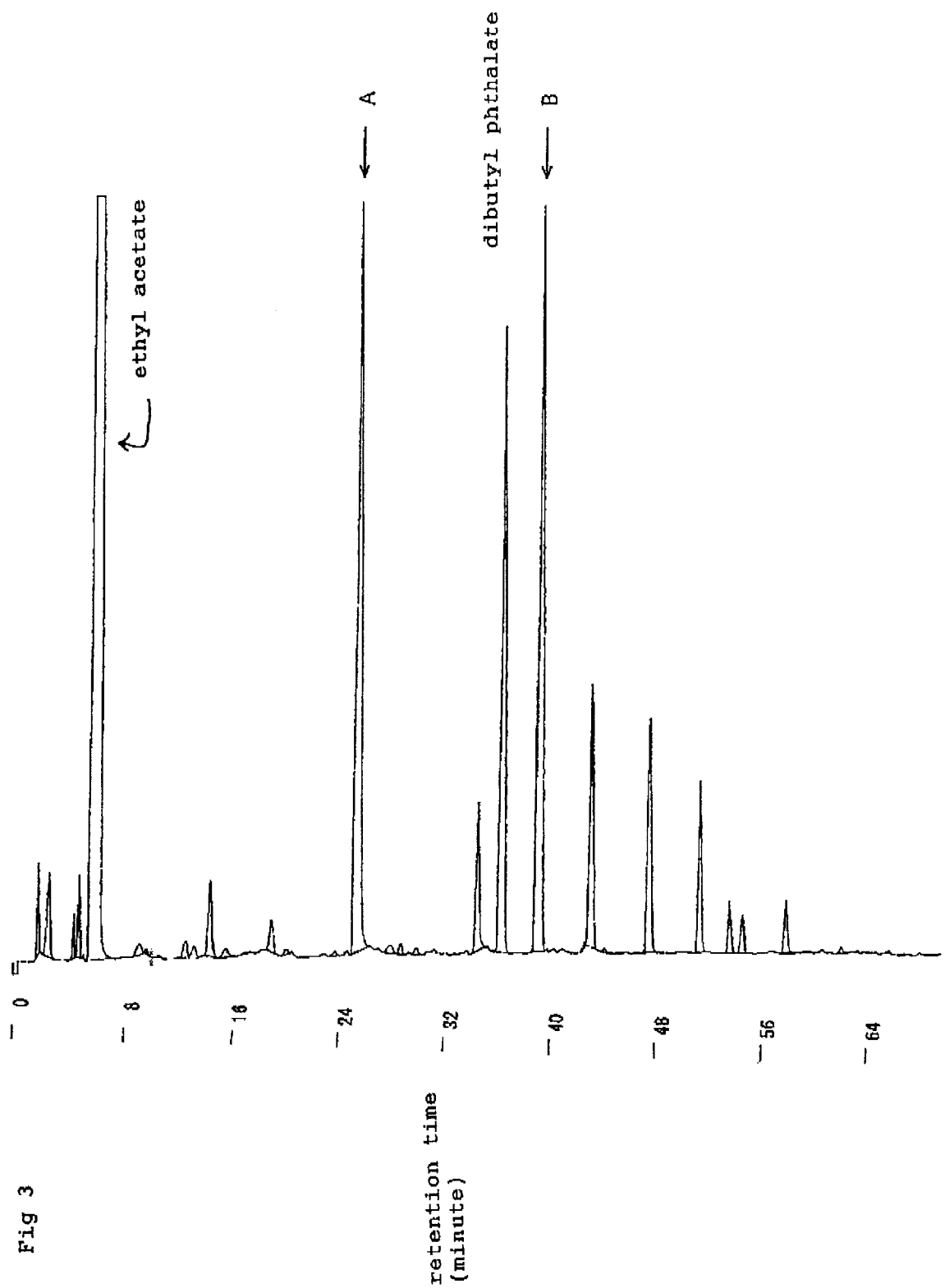
FIG. 3 is a chart given by high-speed liquid chromatography using dibutyl phthalate as internal standard, showing extractables from yet another lot of C.I. Pigment Red 254 (Sample 3) by ethyl acetate.

FIGS. 1–3 are charts each showing extractables in the solution extracted with ethyl acetate. The extractables are from one of three lots of C.I. Pigment Red 254 available from the same manufacturer and detected by high-speed liquid chromatography using dibutyl phthalate as internal standard. When the three charts are compared with one another, significant differences are observed with respect to given peaks on both sides of a peak at the retention time (about 36 minutes) of dibutyl phthalate. Hereinafter, a retention time for a target peak will be represented by a ratio based on the retention time (about 36 minutes) of dibutyl phthalate. The ratio is equivalent to the above-mentioned relative retention ratio based on the retention time of dibutyl phthalate. Thus, hereinafter, this is simply referred to as "relative retention ratio".

Particularly in FIG. 3, great peaks are observed at a retention time of about 25 minutes equivalent to a relative retention ratio of about 0.70 and at a retention time of about 39 minutes equivalent to a relative retention ratio of about 1.08. In FIGS. 1–3, the symbol A represents the peak at the retention time of about 25 minutes equivalent to the relative retention ratio of about 0.70 whereas the symbol B represents the peak at the retention time of about 39 minutes equivalent to the relative retention ratio of about 1.08. It is noted that in FIG. 1, no peak was observed at the retention time of about 25 minutes equivalent to the relative retention ratio of about 0.70. In each of the charts, an area of Peak A at the relative retention ratio of about 0.70 (about 25 minutes) and an area of Peak B at the relative retention ratio of about 1.08 (about 39 minutes) were each divided by an area of all the extracts by ethyl acetate. That is, they were divided by an area of all the peaks exclusive of a peak (about 36 minutes) of dibutyl phthalate, detected after the elution of ethyl acetate. Calculated values (percentage area) are listed in Table 1.

TABLE 1

| | Percentage area of each peak | | |
|---|---|---|---|
| | FIG. 1 | FIG. 2 | FIG. 3 |
| Peak A at relative retention ratio of about 0.70 | 0 | 2.6% | 29.7% |

TABLE 1-continued

| | Percentage area of each peak | | |
|---|---|---|---|
| | FIG. 1 | FIG. 2 | FIG. 3 |
| Peak B at relative retention ratio of about 0.80 | 2.2% | 14.7% | 28.4% |
| Total | 2.2% | 17.3% | 58.1% |

As seen in the figures, the extracts from the pigment with the organic solvent, such as ethyl acetate, vary greatly from lot to lot. In a case where a pigment, such as shown in FIG. 3, having a great combined area of the peaks detected at the relative retention ratio of 0.68 to 0.72 and at the relative retention ratio of 1.06 to 1.10 is used in a pigment-dispersion photo-sensitive coating solution, the resultant coating solution produces a colored image reduced in contrast. Further, such a pigment adversely affects the transmittance and surface roughness of the image. The term "contrast" herein means a ratio (parallel luminance/normal luminance) between a luminance measured when two polarizers with a transparent substrate with a colored coating film interposed therebetween have their polarization axes in parallel relation and a luminance measured when these polarizers have their polarization axes in vertical relation. The greater the ratio, the more clear image can be displayed. Hence, the invention employs the pigment wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

It is more preferred that the combined peak area is not more than 25% of the area of all the extracts.

Although a pigment other than that having the above feature may be admixed to the pigment-dispersion photo-sensitive coating solution of the invention for the toning purpose, a main component of pigments in the solution must be the pigment(s) with the above feature.

The invention effectively works when C.I. Pigment Red 254 is used as the main pigment, but is not limited to this. For instance, the invention is also applicable to the use of another pigment having the diketopyrolopyrrole structure or a pigment for a color filter which is surface treated the same way as C.I. Pigment Red 254. Where C.I. Pigment Red 254 is used as the main pigment, any of the following yellow pigments, orange pigments or other red pigments may be used for toning.

Examples of a usable yellow pigment include C.I. Pigment Yellow 20, 24, 31, 53, 83, 86, 93, 94, 109, 110, 117, 125, 137, 138, 139, 147, 148, 150, 153, 154, 166 and 173.

Examples of a usable orange pigment include C.I. Pigment Orange 13, 31, 36, 38, 40, 42, 43, 51, 55, 59, 61, 64, 65, 71 and 73.

Examples of a usable red pigment include C.I. Pigment Red 9, 97, 105, 122, 123, 144, 149, 166, 168, 176, 177, 180, 192, 215, 216, 224 and 242.

Among them, the yellow pigment, C.I. Pigment Yellow 83 or 139 in particular, is preferred as the toning pigment for C.I. Pigment Red 254.

As required, the pigment may be subjected to a treatment which includes, for example, rosin treatment, surface treatment using a pigment derivative having an acidic group or basic group introduced, pulverizing treatment such as that by kneader pulverizing method, and cleaning treatment for removal of impurities using an organic solvent or water.

The mixing ratio of the pigment, including the toning pigment if used, is preferably in the range of 5 to 60 wt %, more preferably of 10 to 50 wt %, based on the total weight of solids in the coating solution. The weight ratio between the main pigment and the toning pigment is preferably in the range of 100:0–50:50, more preferably of 100:0–60:40.

The binder resin is an alkali-soluble resin which forms a coating film on the substrate and acts as a dispersion medium for the pigment. According to the invention, any of the various binder resins used in the art is usable. Copolymers having carboxyl groups may preferably be used as the binder resin. Particularly preferred is a copolymer of a carboxyl-group containing monomer and another monomer copolymerizable therewith.

The carboxyl-group containing monomer is exemplified by unsaturated carboxylic acid possessing at least one carboxyl group in the molecule such as unsaturated monocarboxylic acid and unsaturated dicarboxylic acid. Specific examples of such an unsaturated carboxylic acid include acrylic acids, methacrylic acids, crotonic acids, itaconic acids, maleic acids and fumaric acids. These carboxyl-group containing monomers may be used alone or in combination of two or more types. The monomer copolymerizable with the carboxyl-group containing monomer is a compound having a polymerizable carbon-carbon unsaturated bond. Specific examples of such a compound include aromatic vinyl compounds such as styrene, α-methyl styrene and vinyltoluene; unsaturated carboxylates such as methyl (meth)acrylate, ethyl(meth)acrylate, butyl(meth)acrylate, 2-hydroxyethyl(meth)acrylate, and benzyl(meth)acrylate; unsaturated aminoalkyl carboxylates such as aminoethyl acrylate; unsaturated glycidyl carboxylates such as glycidyl (meth)acrylate; vinyl carboxylates such as vinyl acetate, and vinyl propionate; and vinyl cyanide compounds such as (meth)acrylonitrile, α-chloroacrylonitrile. These monomers may also be used alone or in combination of two or more types. The copolymer preferably contains the carboxyl-group containing monomer in amounts of 10 to 50 wt %, more preferably of 15 to 40 wt %, based on the total weight of the monomers.

Preferred examples of the carboxyl-group containing copolymer include benzyl methacrylate-methacrylic acid copolymer, benzyl methacrylate-methacrylic acid-styrene copolymer, methyl methacrylate-methacrylic acid copolymer, and methyl methacrylate-methacrylic acid-styrene copolymer. These carboxyl-group containing copolymers may preferably have a mean molecular weight of 5,000 to 400,000, more preferably of 10,000 to 300,000 as determined by gel permeation chromatography using polystyrene as standard. The mixing ratio of the binder resin is normally in the range of 5 to 90 wt %, more preferably of 20 to 70 wt %, based on the total weight of solids in the coating solution.

The pigment-dispersion photo-sensitive coating solution of the invention may employ any of the various solvents known in the art. Specific examples of the solvent include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkylether acetates such as methyl cellosolve acetate and ethyl cellosolve acetate; alkylene glycol alkylether acetates such as propylene glycol monomethylether acetate, propylene glycol monoethylether acetate, propylene glycol monopropylether acetate, methoxybutyl acetate, and methoxypentyl acetate; aromatic hydrocarbons such as benzene, toluene and xylene; ketones such as methyl ethyl ketone, acetone, methyl amyl ketone, methyl isobutyl ketone and cyclohexanone; alcohols such as ethanol, propanol, butanol, hexanol, cyclohexanol, ethylene glycol and glycerin: esters such as ethyl 3-ethoxypropionate and methyl 3-methoxypropionate; and cyclic esters such as γ-butyrolactone. These solvents may be used alone or in combination of two or more types. The mixing ratio of the solvent is preferably in the range of 50 to 90 wt %, more preferably of 60 to 85 wt %, based on the total weight of the coating solution including the solvent.

Generally, the pigment-dispersion photo-sensitive coating solution of the invention may further contain a photo-polymerizable monomer and a photo-polymerization initiator. Besides, other additives may be admixed as required.

The photo-polymerizable monomer is a compound which is brought into polymerization process by the action of light and the photo-polymerization initiator. Generally, compounds having the polymerizable carbon-carbon unsaturated bond fall into the category of photo-polymerizable monomer. The photo-polymerizable monomer may be a monofunctional monomer, difunctional monomer or polyfunctional monomer. Specific examples of the monofunctional monomer include nonylphenyl carbitol acrylate, 2-hydroxy-3-phenoxypropyl acrylate, 2-ethylhexyl carbitol acrylate, 2-hydroxyethyl acrylate and N-vinylpyrrolidone. Specific examples of the difunctional monomer include 1,6-hexanediol(meth)acrylate, ethylene glycol di(meth)acrylate, neopentyl glycol di(meth)acrylate, triethylene glycol di(meth)acrylate, bis(acryloyloxyethyl)ether of bisphenol A and 3-methylpentanediol di(meth)acrylate. Specific examples of the polyfunctional monomer include trimethylolpropane tri(meth)acrylate, pentaerythritol tri(meth) acrylate, penthaerythritol tetra(meth)acrylate, dipentaerythritol penta(meth)acrylate and dipentaerythritol hexa(meth) acrylate.

These photo-polymerizable monomers may be used alone or in combination of two or more types. It is particularly preferred to use at least one type of polyfunctional monomer having two or more functional groups. The mixing ratio of the photo-polymerizable monomer is generally in the range of 0.1 to 60 parts by weight, preferably of 1 to 30 parts by weight based on 100 parts by weight of total of binder resin and photo-polymerizable monomer.

A usable photo-polymerization initiator may be any of those normally used in the art. Examples thereof include acetophenones, benzoins, benzophenones, thioxanthones and triazines. Specific examples of the acetophenone initiator include diethoxyacetophenone, 2-hydroxy-2-methyl-1-phenylpropane-1-one, benzyl dimethyl ketal, 2-hydroxy-2-methyl-1-[4-(2-hydroxyethoxy)phenyl]propane-1-one, 1-hydroxycyclohexyl phenyl ketone, 2-methyl-2-morpholino-1-(4-methylthiophenyl)propane-1-one, 2-benzyl-2-dimethylamino-1-(4-morpholinophenyl)butane-1-one and oligomers of 2-hydroxy-2-methyl-1-[4-(1-methylvinyl)phenyl]propane-1-one. Specific examples of the benzoin initiator include benzoin, benzoin methyl ether, benzoin ethyl ether, benzoin isopropyl ether and benzoin isobutyl ether. Specific examples of the benzophenone initiator include benzophenone, methyl o-benzoylbenzoate, 4-phenyl benzophenone, 4-benzoyl-4'-methyldiphenyl sulfide, 3,3',4,4'-tetra(tert-butyl peroxycarbonyl) benzophenone and 2,4,6-trimethyl benzophenone. Specific examples of the thioxanthone initiator include 2-isopropylthioxanthone, 4-isopropylthioxanthone, 2,4-diethylthioxanthone, 2,4-dichlorothioxanthone and 1-chloro-4-propoxythioxanthons. Specific examples of the triazine initiator include 2,4-bis(trichloromethyl)-6-(4-methoxyphenyl)-1,3,5-triazine, 2,4-bis(trichloromethyl)-6-(4-methoxynaphthyl)-1,3-5-triazine, 2,4-bis (trichloromethyl)-6-piperonyl-1,3,5-triazine, 2,4-bis (trichloromethyl)-6-(4-methoxystyryl)-1,3,5-triazine, 2,4-bis(trichloromethyl)-6-[2-(5-methylfuran-2-yl)ethenyl]-1,3, 5-triazine, 2,4-bis(trichloromethyl)-6-[2-(furan-2-yl) ethenyl]-1,3,5-triazine, 2,4-bis(trichloromethyl)-6-[2-(4-diethylamino-2-methylphenyl)ethenyl]-1,3,5-triazine and 2,4-bis(trichloromethyl)-6-[2-(3,4-dimethoxyphenyl) ethenyl]-1,3,5-triazine. Specific examples of the other initiator include 2,4,6-trimethyl benzoyl diphenylphosphine oxide, 2,2'-bis(o-chlorophenyl)-4,4',5,5'-tetraphenyl-1,2'-biimidazole, 10-butyl-2-chloroacridone, 2-ethyl anthraquinone, benzyl, 9,10-phenanthrenequinone, camphorquinone, methyl phenylglyoxylate and titanocene compound. These photo-polymerization initiators may also be used alone or in combination of two or more types.

Further, the photo-polymerization initiator may be used in combination with a photo-polymerization promotor. The photo-polymerization promotor may be, for example, amines and alkoxyanthracenes. Specific examples of the promotor include triethanolamine, methyldiethanolamine, triisopropanolamine, methyl 4-dimethylaminobenzoate, ethyl 4-dimethylaminobenzoate, isoamyl 4-dimethylaminobenzoate, benzoic acid 2-dimethylamino ethyl, 4-dimethylaminobenzoic acid 2-ethylhexyl, N,N-dimethyl paratoluidine, 4,4'-bis(dimethylamino) benzophenone (commonly called Michler's ketone), 4,4'-bis (diethylamino)benzophenone, 9,10-dimethoxyanthracene, 2-ethyl-9,10-dimethoxyanthracene, 9,10-diethoxyanthracene and 2-ethyl-9,10-diethoxyanthracene. These photo-polymerization promotors may be used alone or in combination of two or more types.

Where the photo-polymerization initiator is used optionally in combination with the photo-polymerization promotor, the combined mixing ratio thereof is generally in the range of 3 to 30 parts by weight, preferably of 5 to 25 parts by weight, based on 100 parts by weight of total of the binder resin and photo-polymerizable monomer.

The pigment-dispersion photo-sensitive coating solution of the invention may further contain an additive, as required, which includes a filler, another polymer compound, a surfactant (pigment dispersant), an adhesion promotor, an anti-oxidant, a UV absorber, an anti-aggregation agent and the like. Specific examples of the filler include glass, silica and alumina. Specific examples of another polymer compound include polyvinyl alcohol, polyacrylic acid, polyethylene glycol monoalkylether and polyfluoroalkyl acrylate. A usable surfactant (pigment dispersant) include those of a nonionic type, a cationic type and an anionic type. Specific examples of the adhesion promotor include vinyl trimethoxysilane, vinyl triethoxysilane, vinyl tris(2-methoxyethoxy)silane, N-(2-aminoethyl)-3-aminopropylmethyl dimethoxysilane, N-(2-aminoethyl)-3-aminopropyltrimethoxysilane, 3-aminopropyltriethoxysilane, 3-glycidoxypropyl trimethoxysilane, 3-glycidoxypropylmethyl dimethoxysilane, 2-(3,4-epoxycyclohexyl) ethyltrimethoxysilane, 3-chloropropylmethyl dimethoxysilane, 3-chloropropyl trimethoxysilane, 3-methacryloyloxypropyl trimethoxysilane and 3-mercaptopropyl trimethoxysilane. Specific examples of the anti-oxidant include 2,2'-thiobis(4-methyl-6-t-butylphenol) and 2,6-di-t-butyl-4-methylphenol. Specific examples of the UV absorber include 2-(3-t-butyl-5-methyl-2-hydroxyphenyl)-5-chlorobenzotriazole and alkoxybenzophenone. Specific examples of the anti-aggregation agent include sodium polyacrylate.

The pigment-dispersion photo-sensitive coating solution of the invention may be prepared as follows, for example. A pigment is previously mixed with a solvent and dispersed therein by a bead mill. The milling is continued until the pigment is reduced to less than 0.2 $\mu$m in mean particle size. At this time, the pigment dispersant may be admixed if required, and a part of or all the amount of binder resin may sometimes be admixed. The resultant dispersion (millbase) is admixed with the remainder of the binder resin as well as a photo-polymerizable monomer, a photo-polymerization promotor and other ingredients which are employed according to needs. If required, the solvent is further added in such an amount that the solvent is present in a predetermined concentration, Thus, a desired pigment-dispersion photo-sensitive coating solution is obtained.

The pigment-dispersion photo-sensitive coating solution thus prepared is applied to the substrate and dried to give a coating film. The film is patterned by light exposure, developed with an alkaline developer and thermoset. Thus is obtained a colored image excellent in display quality, such as color reproduction, and in reliability. A color filter having this colored image is incorporated into a color liquid crystal display, thus constituting a liquid crystal panel. The patterning light exposure is normally conducted by a method where the coating film is exposed to ultraviolet rays via a mask for forming a desired image. In this case, a mask aligner or the like may preferably be used for irradiating the whole target area with uniform, parallel light rays.

The developer used for developing the image after the patterning light exposure normally is an aqueous solution comprising an alkaline compound and a surfactant. The usable alkaline compound may be of an inorganic type or an organic type. Specific examples of the inorganic alkaline compound include sodium hydroxide, potassium hydroxide, disodium hydrogen phosphate, sodium dihydrogen phosphate, diammonium hydrogen phosphate, monoammonium phosphate, monobasic potassium phosphate, sodium silicate, potassium silicate, sodium carbonate, potassium carbonate, sodium acid carbonate, potassium acid carbonate, sodium borate, potassium borate and ammonia. Specific examples of the organic alkaline compound include tetramethylammnonium hydroxide, 2-hydroxyethyl trimethylammoniumhydroxide, monomethylamine, dimethylamine, trimethylamine, monoethylamine, diethylamine, triethylamine, monoisopropylamine, diisopropylamine and ethanolamine. The inorganic and organic alkaline compounds may be used alone or in combination of two or more types. The alkaline compound is preferably present in the alkaline developer in concentrations of 0.01 to 10 wt %, more preferably of 0.03 to 5 wt %.

The usable surfactant may be any of a nonionic type, a cationic type and an anionic type. Specific examples of the nonionic surfactant include polyoxyethylene alkyl ether, polyoxyethylene aryl ether, polyoxyethylene alkylaryl ether, other polyoxyethylene derivatives, oxyethylene-oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester and polyoxyethylene alkylamine.

Specific examples of the anionic surfactant include higher alcohol sulfates such as sodium lauryl alcohol sulfate and sodium oleyl alcohol sulfate; alkyl sulfates such as sodium lauryl sulfate and ammonium lauryl sulfate: alkylaryl sulfonates such as sodium dodecylbenzenesulfonate and sodium dodecylnaphthalenesulfonate. Specific examples of the cationic surfactant include amine salts such as stearylamine hydrochloride and lauryl trimethylammonium chloride; and quaternary ammonium salt. The surfactants may be used alone or in combination of two or more types. The surfactant may be present in the alkaline developer normally in concentrations of 0.01 to 10 wt %, preferably of 0.05 to 8 wt % and more preferably of 0.1 to 5 wt %.

A colored image corresponding to a color of a pigment in the coating solution is obtained through the procedure comprising the steps of applying the aforementioned coating solution, drying the coating solution thus applied, patterning the dried coating film by light exposure, and developing the exposed film. A color filter is obtained by repeating the procedure for each of the colors required by the color filter. Normally, the color filter normally includes the colored images of red, green and blue arranged on the substrate. The above procedure is performed using a coating solution with a pigment of a color corresponding to any one of the three colors thereby giving an image of the color. Images of the other colors are each obtained in a similar manner using a coating solution containing a pigment of a color corresponding to each of the desired colors. Thus, the colored images of three colors can be arranged on the substrate.

As mentioned above, the invention is effective in the use of the red-pigment dispersion based on C.I. Pigment Red 254. Therefore, the red colored image may be formed with a pigment-dispersion photo-sensitive coating solution according to the present invention while colored images of the other colors may be prepared with pigment-dispersion photo-sensitive coating solutions prepared by a conventional method. The colored image formed from the pigment-dispersion photo-sensitive coating solution of the invention is excellent in contrast as well as in transmittance and surface roughness. Thus, the use of the pigment-dispersion photo-sensitive coating solution permits the production of a color filter excellent in transmittance, surface roughness and contrast. When incorporated in the color liquid crystal display unit, the color filter provides a liquid crystal panel featuring excellent display quality, such as color reproduction, and high reliability.

Examples of the invention will hereinbelow be described in detail. The invention should not be limited by these examples. In the following examples, the units of % and part indicating the content and mixing ratio are based on weight unless otherwise specified.

Analysis of Pigment

Samples were prepared from three lots of C.I. Pigment Red 254 available from the same manufacturer. The following procedure was taken to analyze extractables obtained using ethyl acetate from the respective lot samples by means of high speed-liquid chromatography.

First, about 100 mg of dibutyl phthalate, a guaranteed reagent, was accurately weighed out and charged into a 50-ml messflask to which ethyl acetate was added in such an amount that the flask was accurately filled up to the mark of 50 ml. Accurately 5 ml of the resultant solution was transferred to another messflask to which ethyl acetate was added in such an amount that the flask was filled up to the mark of 50 ml, thus giving an internal standard solution. Approximately 100 mg of sample (C.I. Pigment Red 254) was weighed out accurately and charged into a centrifuge tube, to which 5 ml of the internal standard solution, as accurately measured, was added. The tube was subjected to an ultrasonic cleaner for 30 minute extraction. Then, 5 µl of the resultant clear supernatant liquid was injected into a column of the high-speed liquid chromatography for analysis. The conditions of the high-speed liquid chromatographic analysis are as follows.

Column: "Sumipax ODS A-212" manufactured by Sumitomo Chemical Analysis Center; particle size, 5 µm; inside diameter, 6.0 mm; length, 150 mm
Elute: Liquid-A, $H_2O$; Liquid-B, $CH_3CN$(for LC)
Flow rate: 1.0 ml/min
Gradient: The concentration of Liquid-B was increased from 40% to 100% at a rate of 1%/min and then Liquid-B was further passed through the column for 10 minutes.
Detection wavelength: 220 nm
Chart speed: 2.5 mm/min The charts of FIGS. 1–3 show the results of the analysis of the three lot samples of C.I. Pigment Red 254 by means of the high-speed liquid chromatography. The calculated percentage area of Peak A at a retention time of about 25 minutes equivalent to a relative retention ratio of about 0.70 and the calculated percentage area of Peak B at a retention time of about 39 minutes equivalent to a relative retention ratio of about 1.08 are shown in the above Table 1. C.I. Pigment Red 254 shown in the chart of FIG. 1 is referred to as Sample 1, C.I. Pigment Red 254 shown in the chart of FIG. 2 is referred to as Sample 2 and C.I. Pigment Red 254 shown in the chart of FIG. 3 is referred to as Sample 3.

Using the three lots of C.I. Pigment Red 254, respective coating solutions were prepared according to the formulation listed in Table 2.

TABLE 2

| Pigment | C.I. Pigment Red 254 | 4.05 parts |
| --- | --- | --- |
|  | C.I. Pigment Yellow 139 | 0.95 parts |
| Binder resin | Benzyl methacrylate-methacrylic acid copolymer*[1] | 5.72 parts |
| Photo-polymerizable monomer | Dipentaerythritol hexacrylate*[2] | 5.72 parts |
| Photo-polymerization initiator | 2-methyl-1-(4-methylthiophenyl)-2-morpholinopropane-1-one*[3] | 1.37 parts |
|  | 2,4-diethylthioxanthone*[4] | 0.69 parts |
| Nonionic pigment dispersant |  | 1.50 parts |
| Solvent | propylene glycol monomethyl ether acetate | 80.00 parts |

*[1]Benzyl methacrylate-methacrylic acid copolymer: percentage composition by weight, 80/20: mean molecular weight, 35,000
*[2]Dipentaerythritol hexacrylate: "KAYARADDPHA" manufactured by Nippon Kayaku Co.,Ltd.
*[3]2-methyl-1-(4-methylthiophenyl)-2-morpholinopropane-1-one: "Irgacure 907" manufactured by Chiba-Geigy AG
*[4]2,4-diethylthioxanthone: "KAYACURE DETX-S" manufactured by Nippon Kayaku Co.,Ltd.

Each of the above coating solutions was applied to a glass substrate (Coning #7059) by a spin coater and the coating film was dried by prebaking for three minutes at 100° C. Subsequently, the dried coating film was subjected to light exposure at 150 mJ/cm² using an ultrahigh pressure mercury lamp and then to postbaking for 30 minutes at 240° C., thus giving a red-colored coating film. After the postbaking, the thickness of the red-colored coating film was measured by a contact-type film thickness meter (DEK TAK; manufactured by Nippon Shinku Co., Ltd.). The substrate formed with the red-colored coating film was interposed between two polarizers so as to determine a ratio between a luminance (parallel luminance) when the polarization axes of the polarizers were in parallel relation and a luminance (normal luminance) when the polarization axes of the polarizers were in vertical relation. The ratio is defined as contrast. The results are listed in Table 3. Table 3 also lists BET specific surface areas for the respective lots of C.I. Pigment Red 254, and the total percentage area of Peak A and Peak B listed in the above Table 1 (expressed as "percentage area of given components" in Table 3).

TABLE 3

|  | Sample 1 | Sample 2 | Sample 3 |
| --- | --- | --- | --- |
| BET specific surface area | 78 m$^2$/g | 76 m$^2$/g | 75 m$^2$/g |
| Percentage area of given components | 2.2% | 17.3% | 58.1% |
| Film thickness | 1.05 μm | 1.10 μm | 1.12 μm |
| Contrast | 456 | 599 | 288 |

A red colored image of a preferable nature may be obtained by a following method. Using Sample 1 or 2, the same procedure until prebake as that in the evaluated examples is taken to obtain a dried coating film. The dried coating film is exposed to light via a photo mask and developed by immersing the film in an alkaline developer such as 0.04% potassium hydroxide aqueous solution containing a surfactant. Finally, the developed film is rinsed with water and postbaked.

The invention permits the selection of a pigment capable of forming a colored image excellent in transmittance, surface roughness and contrast, even if the pigment varies in quality from lot to lot. The use of the pigment-dispersion photo-sensitive coating solution containing the pigment thus selected ensures that the colored image of stable quality is formed. Additionally, a color liquid crystal panel excellent in the display quality, such as color reproduction, and the reliability can be produced by mounting a color filter with the colored image thus formed.

What is claimed is:

1. A pigment-dispersion photo-sensitive coating solution which comprises a binder resin, an organic-solvent and a main pigment, C.I. Pigment Red 254, dispersed in the solvent, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

2. The pigment-dispersion photo-sensitive coating solution according to claim 1, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 25% of the total area of all peaks when the pigment is extracted by ethyl acetate and the extracts are analyzed by high-speed liquid chromatography using dibutyl phthalate as internal standard.

3. The pigment-dispersion photo-sensitive coating solution according to claim 1, which further comprises a toning pigment.

4. The pigment-dispersion photo-sensitive coating solution according to claim 3, wherein the weight ratio between the main pigment and the toning pigment is in the range of 100:0–50:50.

5. The pigment-dispersion photo-sensitive coating solution according to claim 1 or 3, wherein the mixing ratio of the pigment, including the toning pigment, is in the range of 5 to 60 wt % based on the total weight of solid in the solution.

6. The pigment-dispersion photo-sensitive coating solution according to claim 1, wherein the binder resin is a copolymer having carboxyl groups.

7. The pigment-dispersion photo-sensitive coating solution according to claim 6, wherein the mixing ratio of the binder resin is in the range of 5 to 90 wt % based on the total weight of solids in the coating solution.

8. The pigment-dispersion photo-sensitive coating solution according to claim 1, which further comprises a photo-polymerizable monomer and a photo-polymerization initiator.

9. A method for producing a pigment-dispersion photo-sensitive coating solution which comprises the step of mixing together a main pigment, C.I. Pigment Red 254, a binder resin and an organic solvent for dispersing the pigment, wherein the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

10. A method for forming a colored-image which comprises the steps of applying a pigment-dispersion photo-sensitive coating solution on a substrate, patterning a resultant coating film by light exposure and developing a colored image, wherein the pigment-dispersion photo-sensitive coating solution comprises a binder resin, an organic-solvent and a main pigment, C.I. Pigment Red 254, dispersed in the organic-solvent, in which the combined area of peaks detected at a relative retention ratio in the range of 0.68 to 0.72 based on a retention time of dibutyl phthalate and peaks detected at a relative retention ratio in the range of 1.06 to 1.10 based on a retention time of dibutyl phthalate is not more than 50% of the total area of all peaks when the pigment is extracted by ethyl acetate and the extracts are analyzed by high-speed liquid chromatography using dibutyl phthalate as internal standard.

* * * * *